United States Patent
Jung (10) Patent No.: US 9,025,379 B2
(45) Date of Patent: May 5, 2015

(54) SEMICONDUCTOR DEVICE AND METHOD OF OPERATING THE SAME

(71) Applicant: SK Hynix Inc., Gyeonggi-do (KR)

(72) Inventor: Yong Il Jung, Gyeongsangbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 139 days.

(21) Appl. No.: 13/844,903

(22) Filed: Mar. 16, 2013

(65) Prior Publication Data

US 2014/0140136 A1    May 22, 2014

(30) Foreign Application Priority Data

Nov. 22, 2012    (KR) .......................... 10-2012-0133023

(51) Int. Cl.
| | | |
|---|---|---|
| G11C 11/34 | (2006.01) | |
| G11C 16/10 | (2006.01) | |
| G11C 11/56 | (2006.01) | |
| G11C 16/04 | (2006.01) | |

(52) U.S. Cl.
CPC ............ *G11C 16/10* (2013.01); *G11C 11/5628* (2013.01); *G11C 16/0483* (2013.01)

(58) Field of Classification Search
CPC ............................ G11C 16/10; G11C 16/0483
USPC .......................................... 365/185.12, 185.24
See application file for complete search history.

(56) References Cited

U.S. PATENT DOCUMENTS

| | | | |
|---|---|---|---|
| 7,429,945 B2 * | 9/2008 | Shiu et al. ...................... 341/156 |
| 7,529,127 B2 * | 5/2009 | Park et al. ................ 365/185.03 |
| 7,602,642 B2 * | 10/2009 | Choi ......................... 365/185.09 |
| 2008/0177934 A1 * | 7/2008 | Yu et al. ......................... 711/103 |
| 2009/0013139 A1 * | 1/2009 | Woo et al. ...................... 711/162 |
| 2010/0290283 A1 * | 11/2010 | Choi et al. ............... 365/185.03 |
| 2011/0280068 A1 * | 11/2011 | Patapoutian et al. .... 365/185.03 |
| 2012/0008402 A1 * | 1/2012 | Park .......................... 365/185.18 |
| 2012/0011306 A1 * | 1/2012 | Park ............................ 711/103 |
| 2012/0063237 A1 * | 3/2012 | Ghilardelli ............... 365/185.24 |

FOREIGN PATENT DOCUMENTS

KR    1020090002812    1/2009

* cited by examiner

Primary Examiner — Michael Tran
(74) *Attorney, Agent, or Firm* — IP & T Group LLP (57) ABSTRACT

A method of operating a semiconductor device includes storing LSB data in a LSB page included in plural pages of corresponding word line group of a first memory block, generating a data combination signal by combining plural sets of LSB data after the step of storing LSB data, storing the data combination signal in a second memory block, and storing MSB data in a MSB page included in the plural pages.

30 Claims, 8 Drawing Sheets

SEMICONDUCTOR DEVICE AND METHOD OF OPERATING THE SAME

CROSS-REFERENCE TO RELATED APPLICATION

This application claims priority from Korean Patent Application No. 10-2012-0133023, filed on Nov. 22, 2012, the contents of which are incorporated herein by reference in its entirety.

BACKGROUND

The embodiments of the present invention relate to a semiconductor device and a method of operating the same, more particularly relates to a semiconductor device for storing data and a method of operating the same.

A semiconductor device may include a memory controller and a memory device. A typical non-volatile memory device is a NAND flash memory device that may retain stored information even when the device is not powered.

The recently developed NAND flash memory device uses a multi-level cell MLC method to increase storage capacity of data, one MLC storing two bit data including least significant bit LSB data and most significant bit MSB data. The MSB data is stored after the LSB data is stored in the memory cell. The previously stored LSB data may get lost because of storage error such as an abnormal stop of operation while storing MSB data. For example, threshold voltage of the memory cell remains erase level or is changed to program level according to the stored LSB data. Subsequently, threshold voltage of the memory cell remains at the erase level or is changed to one of first to third program levels according to MSB data, when the MSB data is stored in the memory cell. In the event that a storage error, such as an abnormal stop of storing of the MSB data, occurs during program operation for storing the MSB data, i.e. change of the threshold voltage of the memory cell, the MSB data stored in a register or a page buffer gets lost, and the threshold voltage of the memory cell increases only up to indefinite level different from a target level. As a result, it may be impossible to verify the stored LSB data, which means that the previously stored LSB data may get lost.

In short, the storage error, such as the abnormal stop of storing data during data storage, may cause loss of previously stored data.

SUMMARY OF THE INVENTION

Embodiments of the present invention provide a semiconductor device for restoring previously stored data despite a storage error such as an abnormal stop of storing data, and a method of operating the same.

A semiconductor device according to one embodiment of the present invention includes a memory controller configured to include a data combination circuit for generating a data combination signal by combining plural sets of LSB data, and a memory device configured to perform a first program operation of storing the LSB data in a LSB page of a word line group selected from a first memory block, a second program operation of storing the data combination signal in a selected page of a second memory block, and a third program operation of storing MSB data in a MSB page of the selected word line group.

A semiconductor device according to another embodiment of the present invention includes a first memory block including plural pages of corresponding word lines divided into two or more word line groups, each of the word line corresponding to a LSB page and a MSB page, a second memory block including a plurality of pages, a data combination circuit configured to generate a data combination signal by combining plural sets of LSB data stored in LSB pages of a word line group selected from the first memory block, and an operation circuit configured to store the LSB data and MSB data in the first memory block and store the data combination signal in the second memory block.

A method of operating a semiconductor device according to one embodiment of the present invention includes storing LSB data in a LSB page included in plural pages of corresponding word line group of a first memory block, generating a data combination signal by combining plural sets of LSB data after the step of storing LSB data, storing the data combination signal in a second memory block, and storing MSB data in a MSB page included in the plural pages.

A semiconductor device according to another embodiment of the present invention includes a memory device configured to perform a first program operation of storing LSB data in a LSB page, a second program operation of storing the data combination signal, and a third program operation of storing MSB data in a MSB page, and a data combination circuit for generating a data combination signal and restoring the LSB data of a LSB page corresponding to an abnormal MSB page where the error occurs.

A semiconductor device may restore previously stored data despite the storage error such as the abnormal stop of storing data, thereby enhancing operation reliability of the semiconductor device.

BRIEF DESCRIPTION OF THE DRAWINGS

The above and other features and advantages of the embodiments of the present invention will become readily apparent by reference to the following detailed description when considered in conjunction with the accompanying drawings wherein.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments may be devised by those skilled in the art that will fall within the spirit and scope of the principles of this disclosure. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
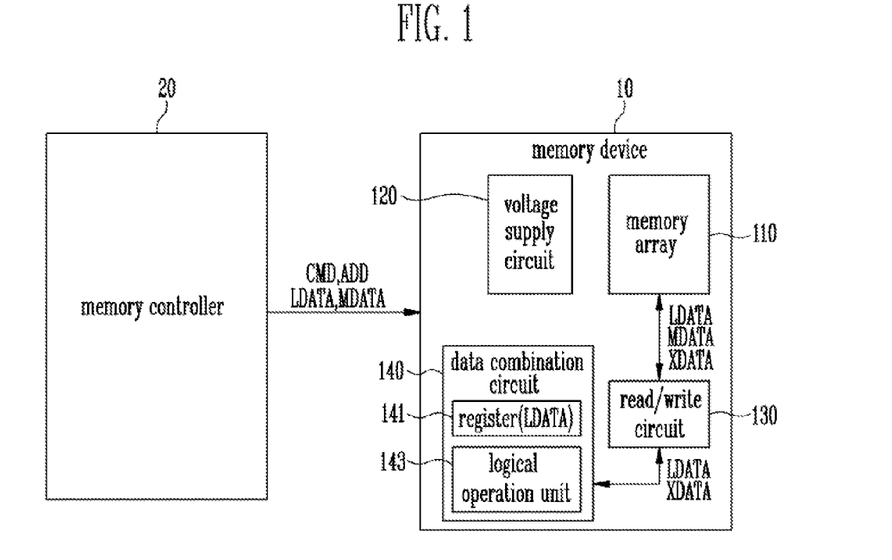
FIG. 1 is a block diagram illustrating a semiconductor device according to an embodiment of the present invention.

FIG. 1 is a block diagram illustrating a semiconductor device according to one embodiment of the present invention.

In FIG. 1, a semiconductor device of the present embodiment may include a memory device 10 and a memory controller 20. The memory device 10 may include a memory array 110, an operation circuit 120 and 130 and a data combination circuit 140.

The memory controller 20 outputs at least one of a command signal CMD for program operation, read operation or erase operation; an address signal ADD for selecting a page including memory cells from the memory array 110; and data LDATA and MDATA to be stored in the selected page to the memory device 10. The data LDATA and MDATA may be a LSB data and a MSB data, respectively.

The memory array 110 of the memory device 10 includes memory blocks, and respective memory block has memory cells coupled to word lines. The word lines are divided into two or more word line groups. Memory cells coupled to one word line may form one page, even-numbered memory cells of the memory cells coupled to the word line may form an even page, and odd-numbered memory cells may form an odd page. One word line may correspond to one page. Each of n word lines WL0 to WLn may correspond to each of n pages.

The operation circuit 120 and 130 may include a voltage supply circuit 120 for supplying voltage to the memory array 110 for each of the program operation, the read operation and the erase operation, and a read/write circuit 130 for storing or reading data LDATA and MDATA in or from the memory cells included in the memory array 110.

The data combination circuit 140 generates a data combination signal by combining plural sets of LSB data stored in LSB pages of a word line group selected from the memory block. The data combination signal is stored in reserved memory block of the memory array 110 by the operation circuit 120 and 130. MSB data is stored in a MSB page of the selected word line group after the data combination signal is stored.

When a storage error, such as abnormal stop of storing of MSB data while MSB data is stored in the MSB page of the selected word line group in the memory array 110, occurs, the data combination circuit 140 restores a LSB data of a LSB page corresponding to an abnormal MSB page where the storage error such as abnormal stop occurs, by using normal LSB data and the data combination signal stored in the memory array 110. The normal LSB data means LSB data corresponding to MSB data that is stored, without error, in a MSB page of the word line group.

The data combination circuit 140 may include a register 141 for storing LSB data and a logical operation unit 143 for generating the data combination signal using the LSB data stored in the register 141. The detailed operation of the device according to one embodiment of the present invention is described with FIGS. 5 to 7.

Figure 2:
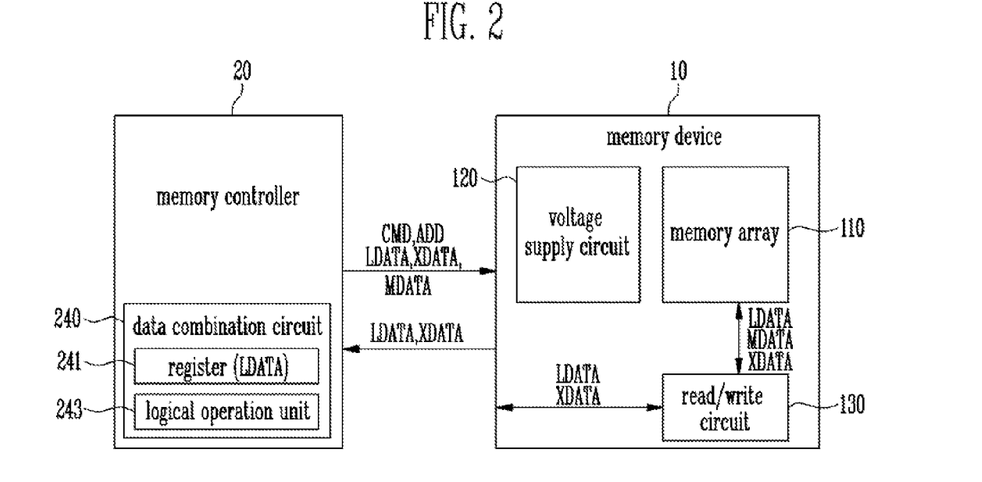
FIG. 2 is a block diagram illustrating a semiconductor device according to another embodiment of the present invention.

FIG. 2 is a block diagram illustrating a semiconductor device according to another embodiment of the present invention.

The embodiment of the present invention shown in FIG. 2 is similar to that shown in FIG. 1, except that a data combination circuit 240 may be included in the memory controller 20. The memory controller 20 stores LSB data LDATA, which is to be stored in at least one LBS page coupled to a word line group of a memory block in the memory array 110, in a register 241 of the data combination circuit 240, and outputs the LSB data LDATA to the memory device 10. In the event that an operation of storing the LSB data LDATA in the LSB pages of the word line group is completed, a data combination signal XDATA generated by the data combination circuit 240 is outputted to the memory device 10, before MSB data MDATA is stored in at least one MSB page of the word line group. The operation circuit 120 and 130 of the memory device 10 stores the data combination signal XDATA in a reserved memory block of the memory array 110. In the event that the MSB data MDATA is outputted from the memory controller 20, the operation circuit 120 and 130 of the memory device 10 stores the MSB data MDATA in the MSB page of the word line group.

When storage error, such as abnormal stop of storing of MSB data while MSB data is stored in the MSB page of the word line group in the memory block of the memory array 110, occurs, the operation circuit 120 and 130 of the memory device 10 reads normal LSB data from the LSB page corresponding to the MSB page, where MSB data is stored without error, of the word line group. The operation circuit 120 and 130 also reads the data combination signal XDATA previously stored in the reserved memory block of the memory array 110, and outputs the read LSB data and the read data combination signal XDATA to the memory controller 20. The data combination circuit 240 of the memory controller 20 restores a LSB data of the LSB page corresponding to an abnormal MSB page, where the storage error such as abnormal stop occurs, by using the normal LSB data LDATA and the data combination signal XDATA. The restored LSB data is outputted to the memory device 10, and the operation circuit 120 and 130 of the memory device 10 stores again the LSB data restored by the data combination circuit 240 in the LSB page corresponding to the abnormal MSB page where the storage error such as abnormal stop occurs.

Detailed description of the elements and the operation method described above is as follows. It is assumed that the data combination circuit is included in the memory device 10.

Figure 3:
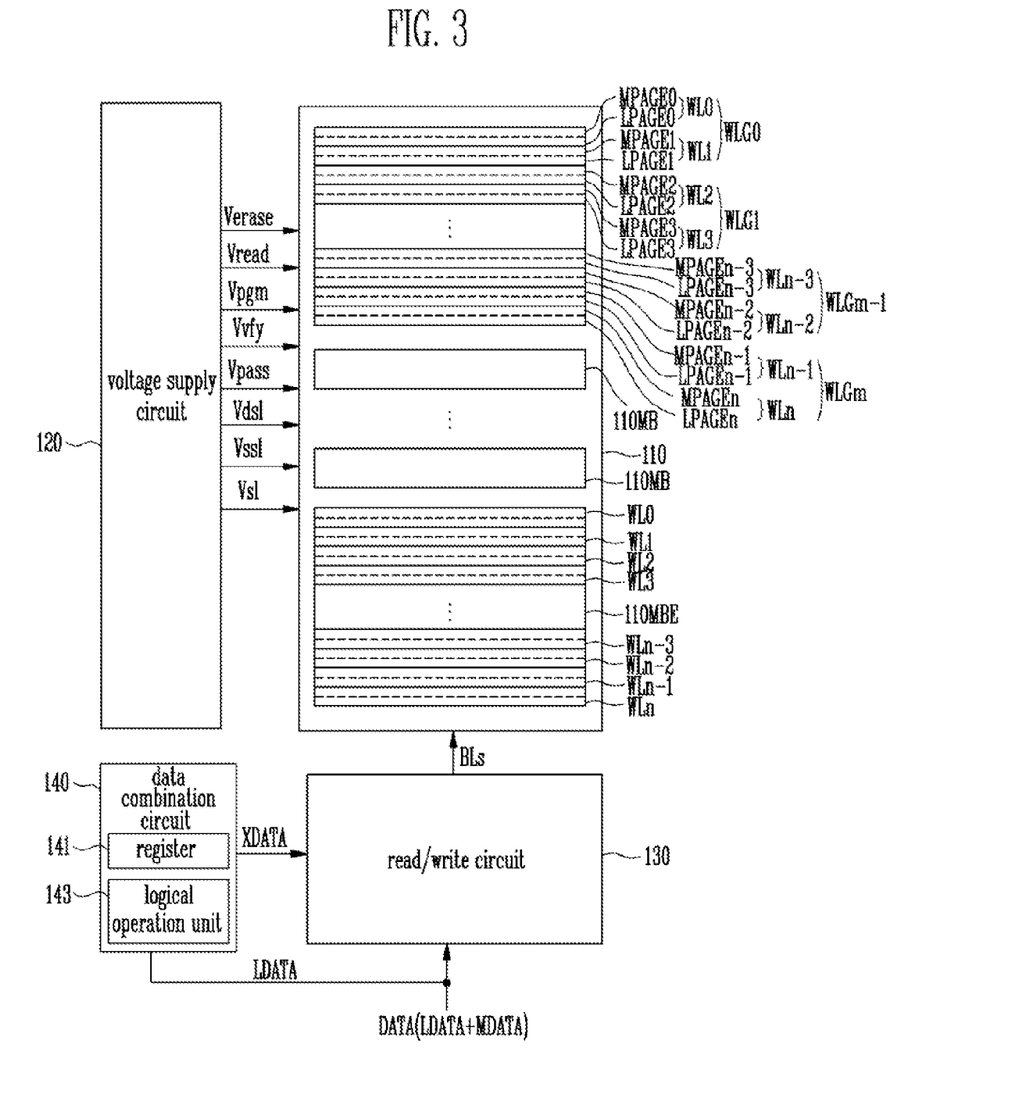
FIG. 3 is a block diagram illustrating the memory device illustrated in FIG. 1.

FIG. 3 is a block diagram illustrating the memory device in FIG. 1.

In FIG. 3, the memory device 10 may include the memory array 110, the operation circuit 120 and 130 and the data combination circuit 140. The operation circuit 120 and 130 performs at least one of read operation, program operation and erase operation of memory cells included in the memory array 110, and may include the voltage supply circuit 120 and the read/write circuit 130.

The memory array 110 includes non-volatile memory blocks 110MB and 110MBE. The memory blocks 110MB may be used for storing data, and the reserved memory block 110MBE may be used for storing the data combination signal XDATA. Each of the memory blocks 110MB and 110MBE may include memory strings coupled to corresponding bit line among bit lines BLs. The memory blocks 110MB and the reserved memory block 110MBE may have substantially the same structure. Hereinafter, the memory block 110MB will be described in detail.

Figure 4:
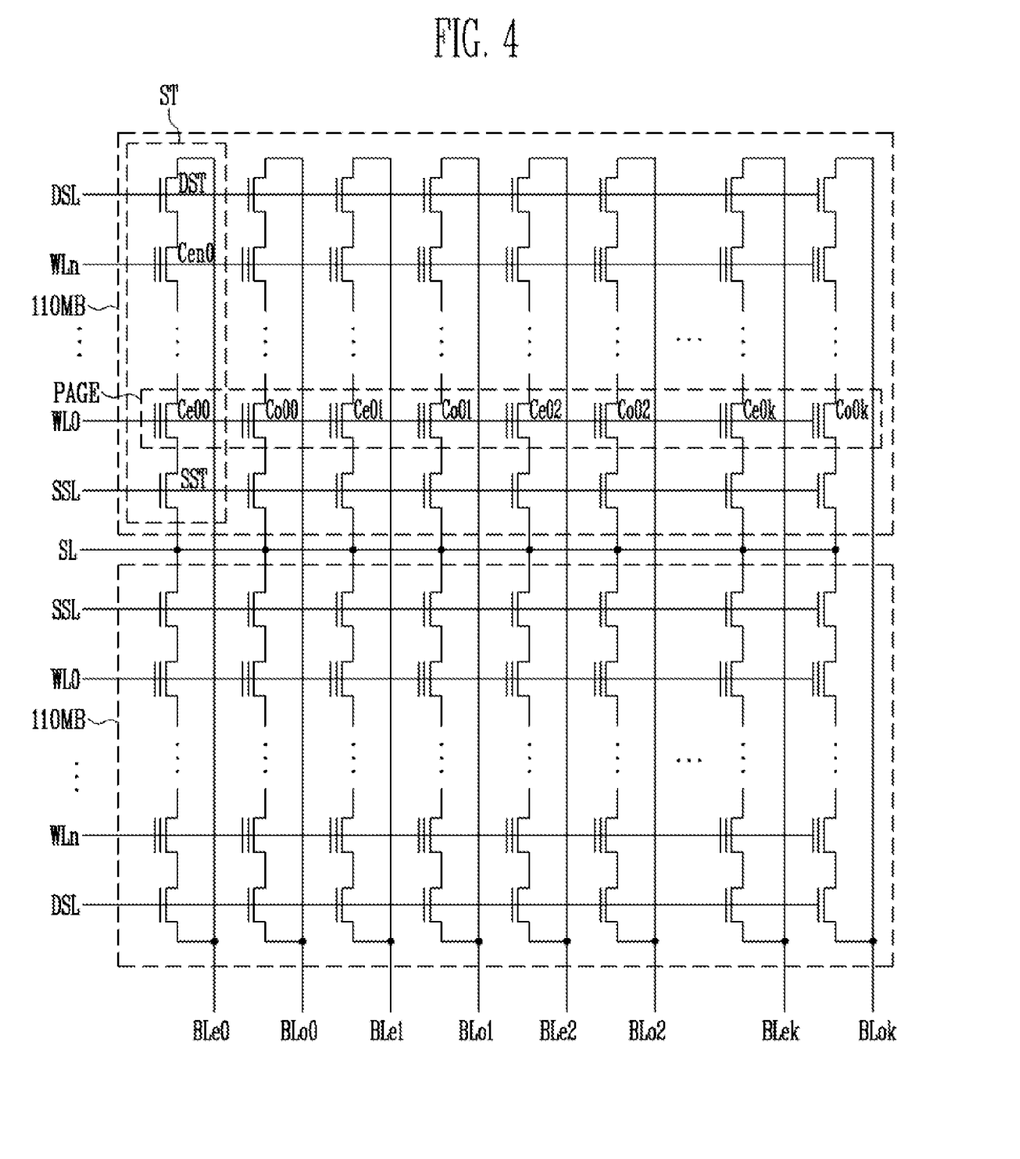
FIG. 4 is a view illustrating a circuit diagram of the memory block illustrated in FIG. 3.

FIG. 4 is a view illustrating circuit diagram of the memory block in FIG. 3.

In FIG. 4, each of the memory blocks 110MB includes memory strings ST coupled between corresponding one of bit lines (for example, k even bit lines BLe0 to BLek and k odd bit lines BLo0 to BLok as shown in FIG. 4) and a common source line SL. The memory strings ST are respectively coupled to corresponding bit line among bit lines BLe0 to BLek and BLo0 to BLok, and are coupled to the common source line SL. Respective memory string ST includes a source select transistor SST, a cell string where memory cells, e.g. n memory cells Ce00 to Cen0, are coupled in series, and a drain select transistor DST. In respective memory string ST, a source of the source select transistor SST is coupled to the common source line SL, and a gate of the source select transistor SST is coupled to a source select line SSL. A drain of the drain select transistor DST is coupled to a corresponding bit line, e.g. BLe0, and a gate of the drain select transistor DST is coupled to a drain select line DSL. The memory cells, e.g. Ce00 to Cen0, in the cell string are coupled in series between the select transistors SST and DST. Each gate of the memory cells is coupled to corresponding word line among word lines WL0 to WLn. Each of n word lines WL0 to WLn may correspond to each of n pages (MPAGE0 to MPAGEn or LPAGE0 to LPAGEn).

The drain select transistor DST controls connection between the memory string ST and the corresponding bit line, e.g. BLe0. The source select transistor SST controls connection between the memory string ST and the common source line SL.

Memory cells of a memory cell block in a NAND flash memory device may be divided into physical pages or logical pages. For example, as one embodiment of the present invention, exemplified memory cells CeN0 to CeNk and CoN0 to CoNk coupled to one word line, e.g. WLN form one physical page (N is a positive integer not greater than n). Even-numbered memory cells CeN0 to CeNk may form one even physical page, and odd-numbered memory cells CoN0 to CoNk may form one odd physical page. A page that comprises an even page and an odd page is a basic unit for program operation or read operation. In the event that 2 bit data including LSB data and MSB data is stored in one memory cell, one page includes a LSB page (LPAGE shown in FIG. 3) for storing the LSB data and a MSB page (MPAGE shown in FIG. 3) for storing the MSB data, which means that a word line may correspond to a page, and that the page may include an even physical page and an odd physical page. The page may include a LSB page and a MSB page, in which case the even page and the odd page may include the LSB page and the MSB page, respectively.

Referring back to FIG. 3, word lines of the memory block 110MB may be divided into two or more word line groups, i.e. m groups of word line WLG0 to WLGm shown in FIG. 3. Each of the word line groups, e.g. WLG0 includes at least two word lines, e.g. WL0 and WL1. The numbers of the word line group and the word lines included in the word line group may vary. Each of the word line groups WLGM (M is a positive integer not greater than k) includes at least two LSB pages LPAGE and at least two MSB pages MPAGE.

The operation circuit 120 and 130 performs at least one operation of erase, program and read of memory cells coupled to a selected word line, e.g. WLn, or memory cells included in a selected page. To perform the operation of program, read or erase, the operation circuit 120 and 130 outputs selectively operation voltages Verase, Vpgm, Vread, Vpass, Vvfy, Vdsl, Vssl and Vsl to local lines, or SSL, WL0 to WLn, and DSL, and the common source line SL of a selected memory block. The operation circuit 120 and 130 also precharges/discharges or senses the bit lines BLe0 to BLek and BLo0 to Blok (shown in FIG. 4). The operation circuit includes the voltage supply circuit 120 and the read/write circuit 130.

The voltage supply circuit 120 supplies one of the operation voltages Verase, Vpgm, Vread, Vpass, Vvfy, Vdsl, Vssl and Vsl to the selected memory block in the memory array 110 according to the operation of program, read or erase of the memory cells.

The read/write circuit 130 precharges selectively the bit lines BLs according to data stored in the memory cells, senses voltage or current of the bit lines BLs, and latches data read from the memory cells.

The data combination circuit 140 performs function described in FIG. 1.

Figure 5:
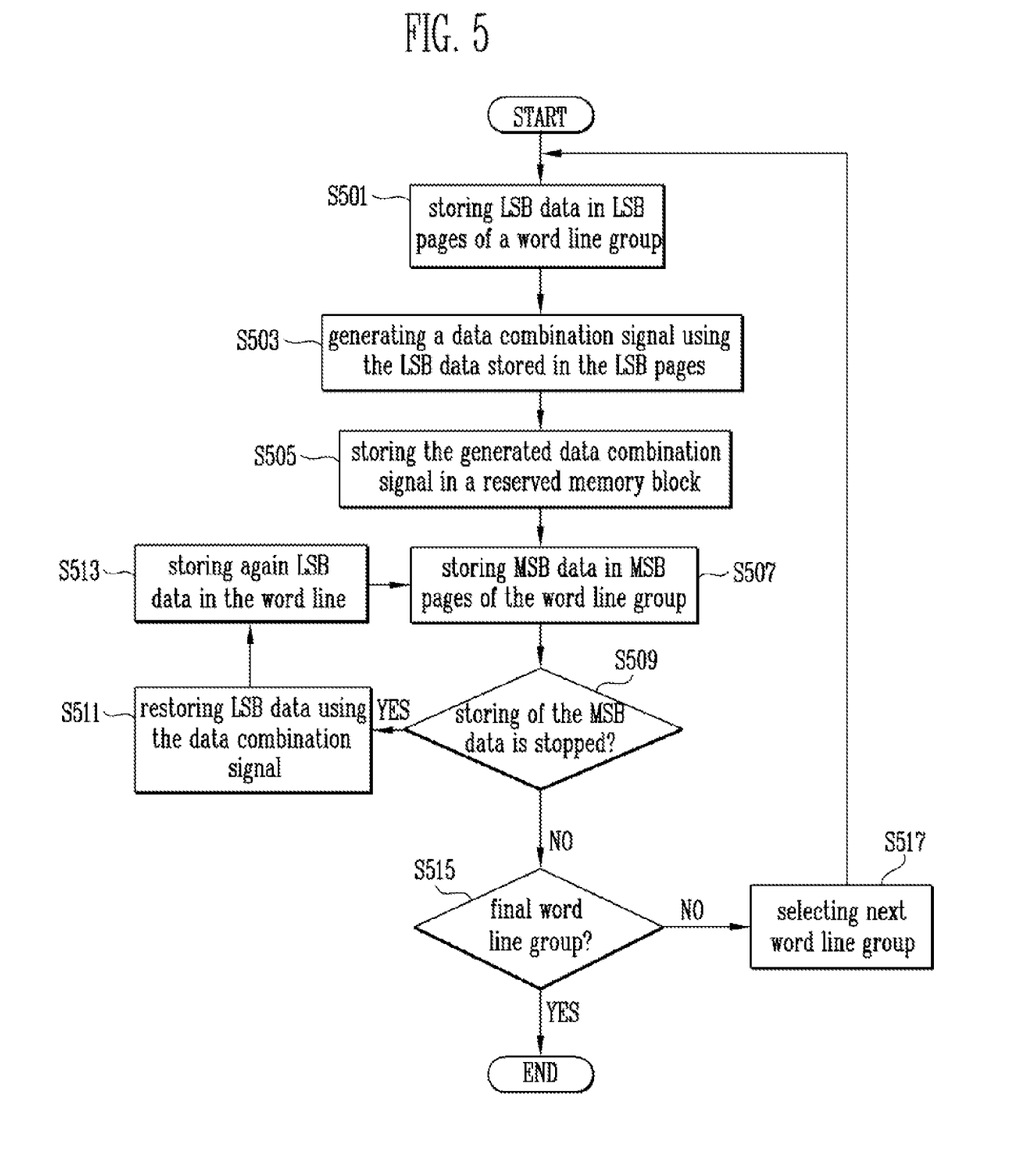
FIG. 5 is a flowchart illustrating an operation of a semiconductor device according to an embodiment of the present invention.
Figure 6:
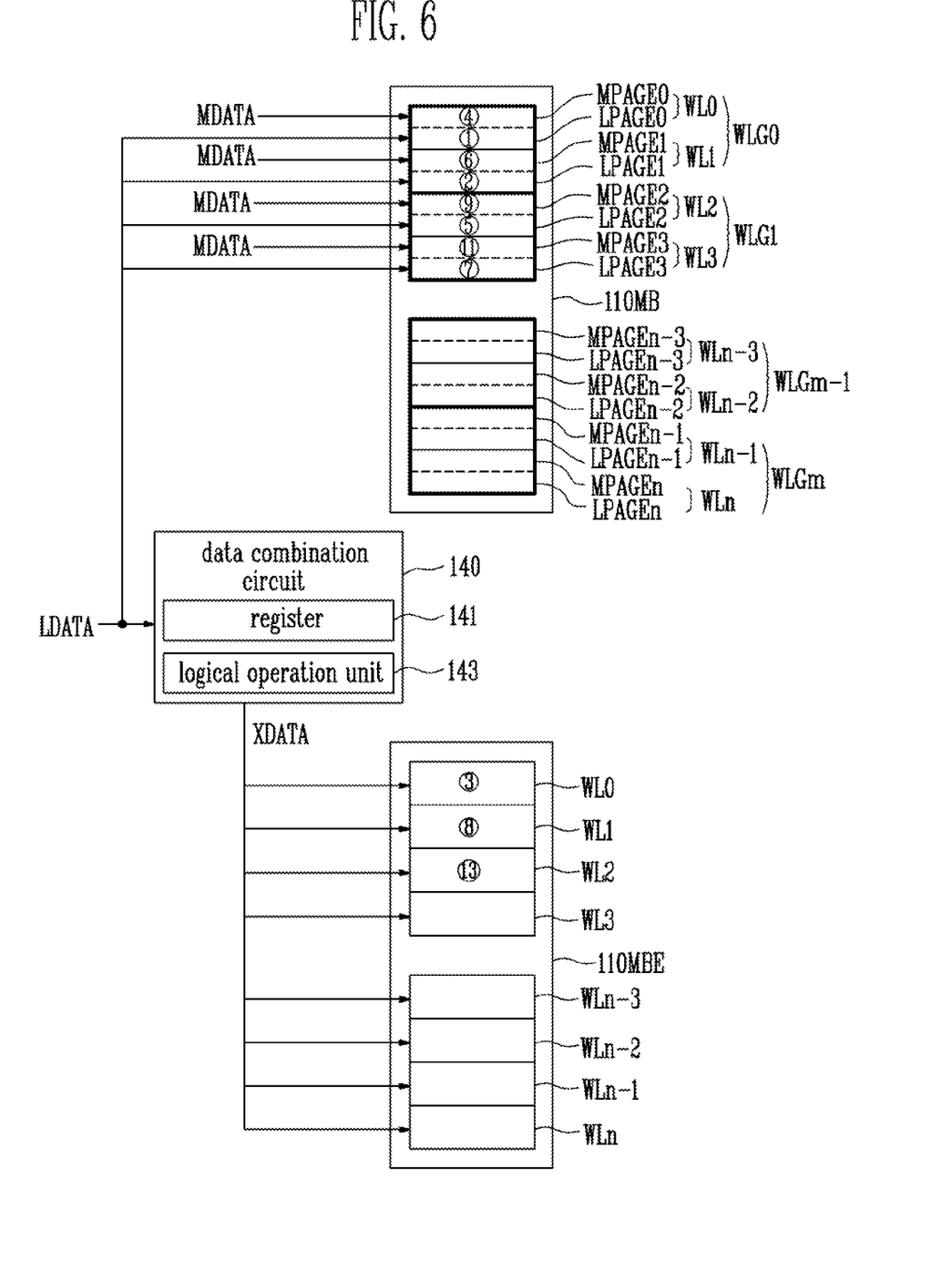
FIGS. 6 and 7 are exemplified block diagrams illustrating part of a semiconductor device to show operation of a semiconductor device shown in FIG. 5.
Figure 7:
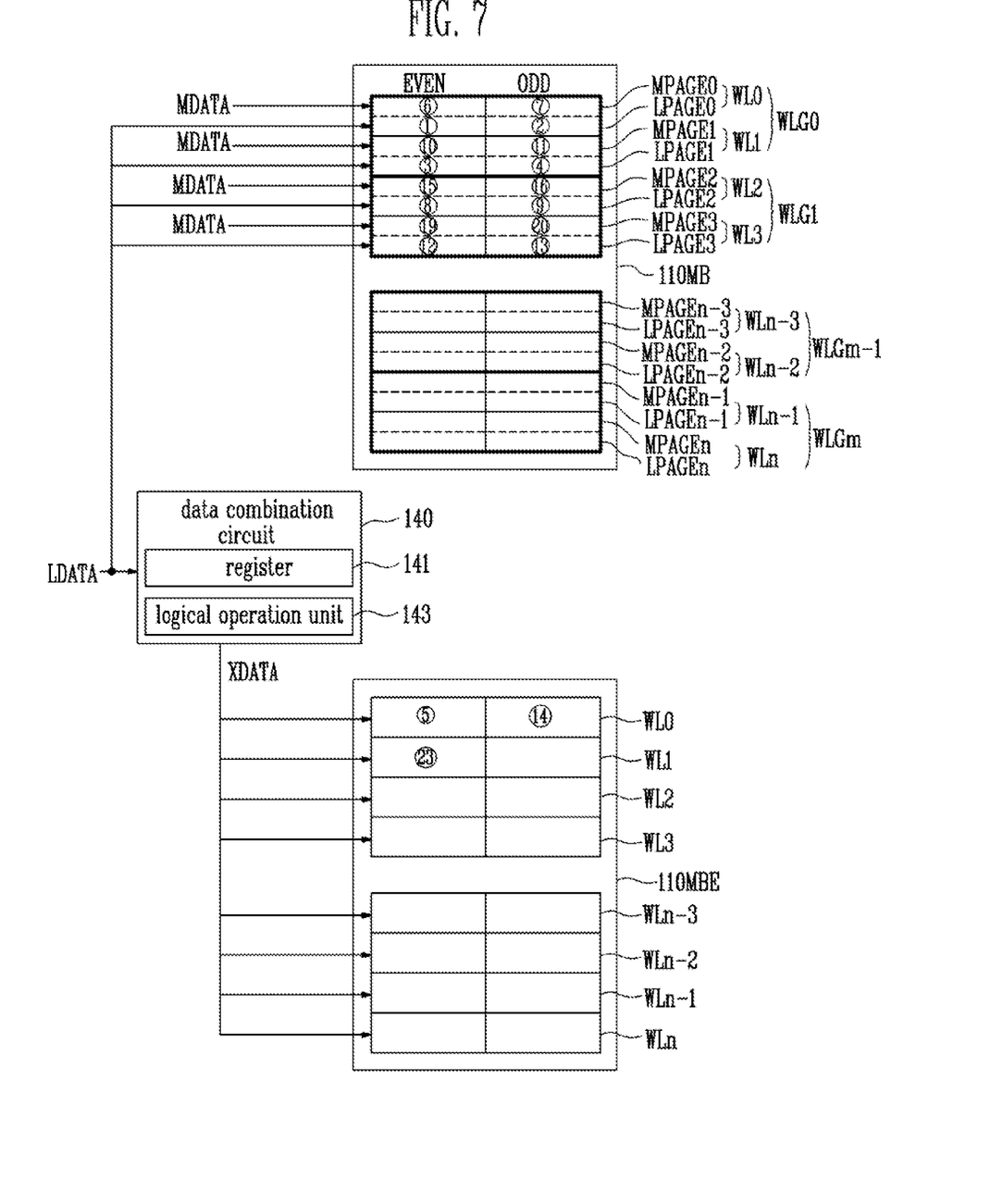

FIG. 5 is a flowchart illustrating operation of a semiconductor device according to an embodiment of the present invention. FIGS. 6 and 7 are exemplary block diagrams illustrating a part of a semiconductor device to show operation of a semiconductor device shown in FIG. 5. In FIGS. 6 and 7, numbers with round brackets refer to order in which data are stored.

Referring to FIGS. 1, 5 and 6, the operation circuit 120 and 130 of the memory device 10 stores in sequence LSB data LDATA in LSB pages LPAGE0 and LPAGE1 of a word line group, e.g. WLG0 selected from the memory block 110MB of the memory array 110 in the event that a program command signal CMD, an address signal ADD and the LSB data LDATA are inputted from the memory controller 20, in step S501. The LSB data LDATA is also stored in the register 141 of the data combination circuit 140.

In step S503, after every LSB data LDATA is stored in the LSB pages LPAGE0 and LPAGE1 of the selected word line group WLG0, the logical operation unit 143 of the data combination circuit 140 generates the data combination signal XDATA using the LSB data LDATA stored in the register 141 and outputs the generated data combination signal XDATA to the operation circuit 120 and 130.

For example, in the event that first LSB data of 8 bits '01011010' is stored in LSB page LPAGE0 and second LSB data of 8 bits '11001100' is stored in LSB page LPAGE1, the data combination signal XDATA having '10010110' is generated according to XOR operation of the stored sets of LSB data, as shown in Table 1.

TABLE 1

01011010⊕11001100=10010110

Data size of the data combination signal XDATA is substantially the same as that of the LSB page, which means that the data combination signal XDATA may be generated by combining plural sets of LSB data LDATA and may represent compressed sets of LSB data stored in the memory array 110.

To prevent loss of stored LSB data through restoration of LSB data stored in the memory array 10 when storage error, such as abnormal stop of storing MSB data because of unintentional cause such as power loss, occurs, the LSB data should be stored in preset memory area. The present invention saves the LSB data in the form of the data combination signal XDATA with minimal use of a memory area for backing up the LSB data.

In step S505, the operation circuit 120 and 130 stores the data combination signal XDATA in the preset area of the reserved memory block 110MBE that corresponds to the LSB pages LPAGE0 and LPAGE1 of selected word line, e.g. WL0. Since LSB data LDATA may not be restored if the data combination signal XDATA stored in the reserved memory block 110MBE is lost, the data combination signal XDATA may be stored in the reserved memory block 110MBE through a single level cell SLC method of storing one bit data in one memory cell, which may reduce storage time of the data combination signal XDATA.

In step S507, in the event that the program command signal CMD, the address signal ADD and MSB data MDATA are inputted from the memory controller 20, the operation circuit 120 and 130 of the memory device 10 stores the MSB data MDATA in MSB pages MPAGE0 and MPAGE1 of the word line group WLG0 selected from the memory block 110MB of the memory array 110.

In step S509, it is detected whether storage error such as abnormal stop occurs while MSB data MDATA is stored in the MSB page MPAGE0 or MPAGE1 of the selected word line group WLG0 of the memory block 110MB.

In the event that the storage error such as the abnormal stop occurs during storage of MSB data MDATA in the MSB page, i.e. MPAGE0, the data combination circuit 140 restores LSB data LDATA of the LSB page LPAGE0 corresponding to the abnormal MSB page MPAGE0 where the storage error such as the abnormal stop occurs, by using the data combination signal XDATA in step S511.

For example, in the event that MSB data is stored in MSB page MPAGE1 without error and the storage error such as the abnormal stop occurs during storage of MSB data MDATA in the MSB page MPAGE0, the operation circuit 120 and 130 reads normal LSB data LDATA from LSB page LPAGE1 corresponding to MSB page MPAGE1, where MSB data is stored without error, in the word line group WLG0 and outputs the read LSB data LDATA to the data combination circuit 140. The operation circuit 120 and 130 also reads the data combination signal XDATA stored in the reserved memory block 110MBE and outputs the read data combination signal XDATA to the data combination circuit 140. The data combination circuit 140 restores LSB data of the LSB page LPAGE0 corresponding to the abnormal MSB page MPAGE0 where the storage error such as the abnormal stop occurs, by using normal LSB data LDATA and the data combination signal XDATA that are read and outputted by the operation circuit 120 and 130, and outputs the restored LSB data to the operation circuit 120 and 130.

For example, in the event that the storage error such as the abnormal stop occurs while storing MSB data in the MSB page MPAGE0, the data combination circuit 140 performs XOR operation about LSB data LDATA, e.g. '11001100' stored in the LSB page LPAGE1 and the data combination signal XDATA, e.g. '10010110' stored in the reserved memory block 110MBE, both of which are read and outputted by the operation circuit 120 and 130, thereby restoring LSB data LDATA, e.g. '01011010' previously stored in the LSB page LPAGE0 as shown in Table 2.

TABLE 2

11001100⊕10010110=01011010

In the event that the storage error occurs, the data combination circuit 140 restores LSB data LDATA of the LSB page LPAGE0 corresponding to the abnormal MSB page MPAGE0 where the storage error such as abnormal stop occurs, by using normal (i−1) LSB data LDATA out of i LSB data LDATA and the data combination signal XDATA. The normal LSB data LDATA and the data combination signal XDATA are outputted from the memory block 110MB and the reserved memory block 110MBE to the data combination circuit 140 by the operation circuit 120 and 130.

In the event that storage error such as abnormal stop occurs while storing MSB data MDATA because of power loss, no information remains in the register 141 of the data combination circuit 140. Hence, the operation circuit 120 and 130 outputs normal LSB data LDATA and the data combination signal XDATA to the data combination circuit 140. However, in the event that storage error such as abnormal stop occurs while storing MSB data by internal error other than power loss, the data combination signal XDATA as well as LSB data are stored in the register 141 of the data combination circuit 140. Accordingly, the operation circuit 120 and 130 need not read normal LSB data LDATA and the data combination signal XDATA from the memory blocks 110MB and 110MBE and output the read normal LSB data LDATA and the read data combination signal XDATA.

In step S513, the operation circuit 120 and 130 stores again the LSB data LDATA, restored by the data combination circuit 140, in LSB page, i.e. LPAGE0 corresponding to the abnormal MSB page, i.e. MPAGE0 where the storage error such as abnormal stop occurs. It may be desirable to delete selectively data stored in the abnormal MSB page and the corresponding LSB page, before storing the restored LSB data in the corresponding LSB page. When the step S513 completed, the process returns back to the step S507.

In the returned step S507, the operation circuit 120 and 130 stores again the MSB data MDATA in the MSB pages MPAGE0 and MPAGE1 of the word line group WLG0 selected from the memory block 110MB of the memory array 110.

In the event that it is determined in the step S509 that an operation of storing MSB data in the MSB pages of the word line group is completed without the storage error such as the abnormal stop, it is determined in step S515 whether the selected word line group is final word line group WLGk, or whether all the pages of the selected memory block in the memory array 110 are processed. In the event that the selected word line group, e.g. WLG0 is not the final word line group WLGk, next word line group, e.g. WLG1 is selected in step S517, and the steps S501 to S515 are iteratively performed until all the pages of the selected memory block in the memory array 110 are processed.

The bigger number of word lines a word line group includes, the smaller number of the data combination signals XDATA the data combination signal 140 generates, and thus the smaller size of memory area the memory device 10 uses for storing the data combination signal XDATA in the reserved memory block 110MBE.

In the event that every operation of storing data in the memory block 110MB is completed, the data combination signals XDATA stored in the reserved memory block 110MBE may be erased.

Different from the embodiment shown in FIG. 6, the embodiment shown in FIG. 7 is for the case that each of pages LPAGE0 to LPAGEn and MPAGE0 to MPAGEn is divided into an even physical page and an odd physical page. As shown in FIGS. 1, 5 and 7, most of the operation of a semiconductor device according to another embodiment of the present invention is substantially same as that shown in FIGS. 1, 5 and 6, except that data LDATA and MDATA are stored respectively in even LSB/MSB pages and odd LSB/MSB pages, and that the data combination circuit 140 may generate the data combination signal XDATA using the LSB data LDATA stored in the respective even and odd LSB pages, and that the data combination signal XDATA is stored in the preset area of the reserved memory block 110MBE according to the LSB data LDATA of the respective even and odd LSB pages.

According to the embodiment shown in FIG. 7, the operation of a semiconductor device of the present invention may be applied to an even odd bit line EOBL-type memory device as well as an all bit line ABL-type memory device. Page buffers are respectively coupled to bit lines in the ABL-type memory device, while a page buffer is coupled to a pair of bit lines including an even bit line and an odd bit line in the EOBL-type memory device.

Figure 8:
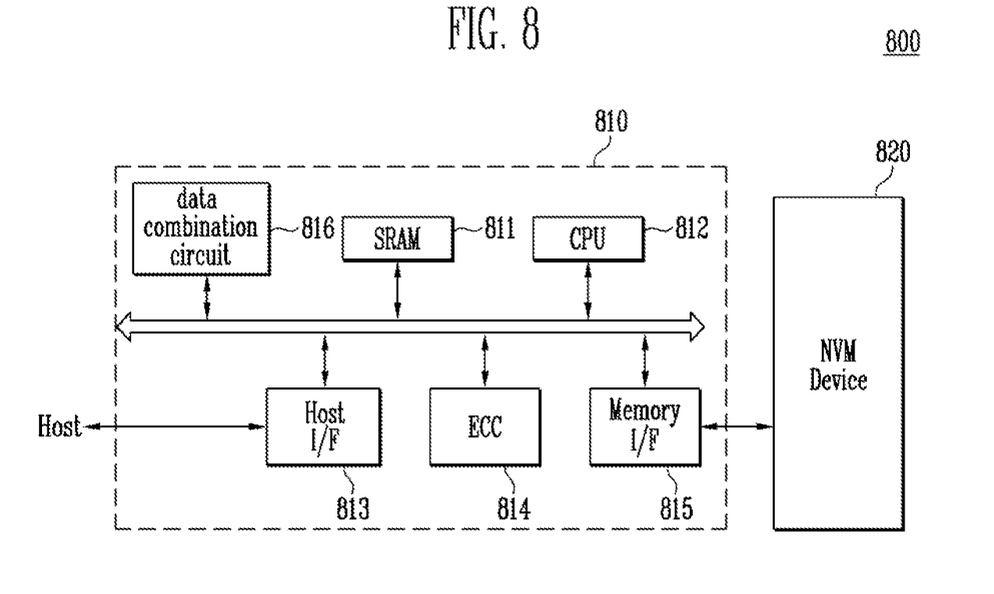
FIG. 8 is a block diagram illustrating a memory system according to an embodiment of the present invention.

FIG. 8 is a block diagram illustrating a memory system according to one embodiment of the present invention.

In FIG. 8, the memory system 800 of the present embodiment may be embodied with a semiconductor device, and include a non-volatile memory device 820 and a memory controller 810.

The memory controller 810 and the non-volatile memory device 820 may be the semiconductor device in FIG. 1 or 2. The memory controller 810 controls the non-volatile memory device 820 in an operation mode such as program operation, read operation or erase operation. The memory controller 810 may further include a data combination circuit 816 that may be the data combination circuit 240 as shown in FIG. 2.

The memory system 800 may be used as a memory card or a solid state disk SSD by combination of the non-volatile memory device 820 and the memory controller 810. An SRAM 811 is used as an operation memory of a processing unit 812. A host interface 813 has data exchange protocol of a host accessed to the memory system 800. An error correction block 814 detects and corrects error of data read from the non-volatile memory device 820. A memory interface 814 interfaces with the non-volatile memory device 820 of the present invention. The processing unit 812 performs control operation for data exchange of the memory controller 810.

The memory system 800 of the present invention may further include a ROM (not shown) for storing code data for interfacing with the host and so on. The non-volatile memory device 820 may be provided as multi-chip package including flash memory chips. The memory system 800 of the present invention may be provided as highly-reliable storage medium having low error possibility. Especially, the flash memory device of the present invention may be included in the SSD, which is studied recently. In this case, the memory controller 810 communicates with an external device, e.g. host through one of various interface protocols such as USE, MMC, PCI-E SATA, RATA, SCSI, ESDI, IDE etc.

Figure 9:
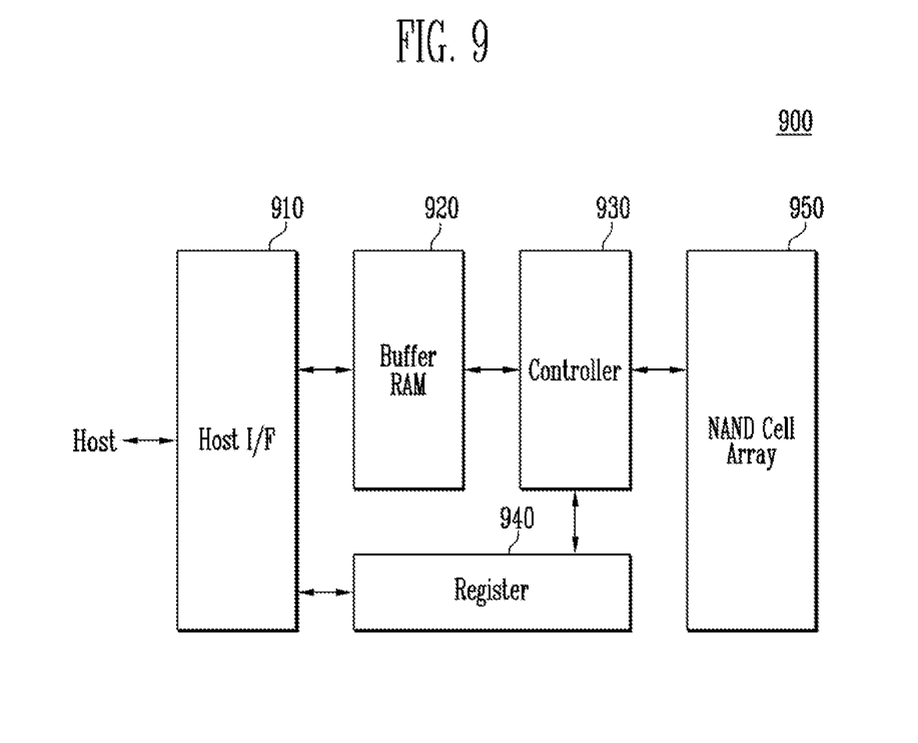
FIG. 9 is a block diagram illustrating a fusion memory device or a fusion memory system for performing a program operation according to the embodiments described above.

FIG. 9 is a block diagram illustrating a fusion memory device or a fusion memory system for performing program operation according to the embodiments described above. For example, features of the present invention may be applied to an OneNAND flash memory device 900 as a fusion memory device.

The OneNAND flash memory device 900 includes a host interface 910 for exchanging information with a device using different protocol, a buffer RAM 920 for embedding code for driving the memory device or storing temporarily data, a controller 930 for controlling reading, programming and every state in response to a control signal and a command inputted from an external device, a register 940 for storing data such as configuration for defining command, address, system operation environment in the memory device, and a NAND flash cell array 950 having an operation circuit including a non-volatile memory cell and a page buffer. The memory array in FIG. 3 may be applied to a memory array of the NAND flash cell array 950.

Figure 10:
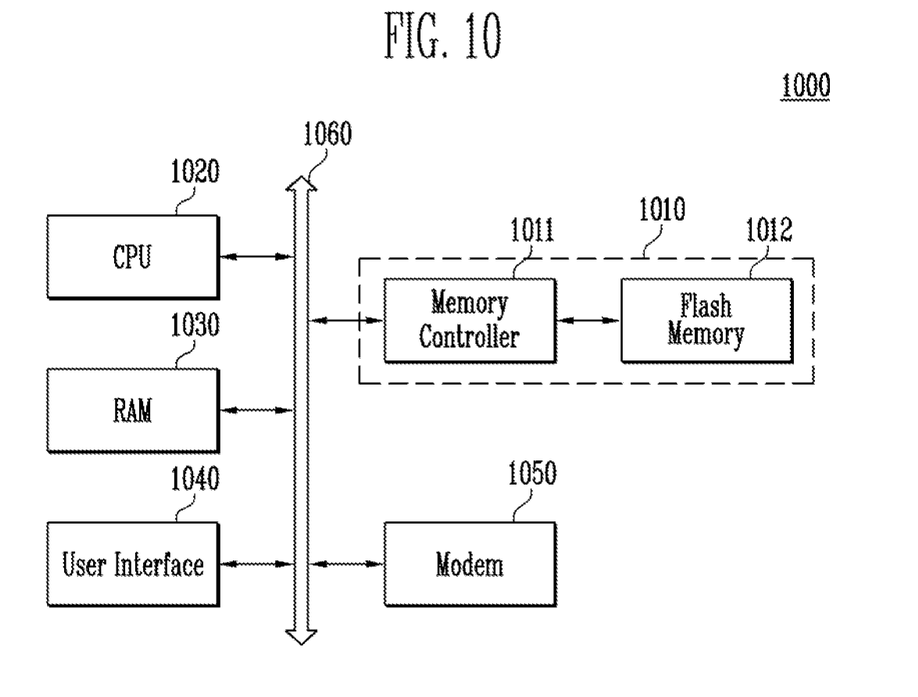
FIG. 10 is a view illustrating a computing system including a flash memory device according to an embodiment of the present invention.

FIG. 10 is a view illustrating a computing system including a flash memory device according to one example embodiment of the present invention.

The computing system 1000 of the present invention includes a microprocessor 1020 connected to a system bus 1060, a RAM 1030, a user interface 1040, a modem 1050 such as a baseband chipset, and a memory system 1010. In the event that the computing system 1000 is a mobile device, a battery (not shown) for supplying an operation voltage of the computing system 1000 may be further provided. The computing system 1000 of the present invention may further include an application chipset, a camera image processor CIS, a mobile DRAM, etc., which are not shown. The memory system 1010 may include an SSD using for example a non-volatile memory for storing data. The memory system 1010 may be applied to a fusion flash memory, e.g. OneNAND flash memory.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor device comprising:
    a memory controller configured to include a data combination circuit for generating a data combination signal by combining plural sets of LSB data; and
    a memory device configured to perform a first program operation of storing the LSB data in a LSB page of a word line group selected from a first memory block a second program operation of storing the data combination signal in a selected page of a second memory block, and a third program operation of storing MSB data in a MSB page of the selected word line group.

2. The semiconductor device of claim 1, wherein the memory device performs the third program operation after the second program operation is completed.

3. The semiconductor device of claim 1, wherein when an error occurs while storing the MSB data in the MSB page, the data combination circuit restores the LSB data of a LSB page corresponding to an abnormal MSB page where the error occurs, by using normal LSB data of LSB pages corresponding to MSB pages where MSB data are stored without error, and the data combination signal.

4. The semiconductor device of claim 3, wherein the memory device outputs the normal LSB data and the data combination signal to the memory controller.

5. The semiconductor device of claim 3, wherein the memory device stores the LSB data restored by the data combination circuit in the LSB page corresponding to the abnormal MSB page.

6. The semiconductor device of claim 1, wherein when an error occurs while storing MSB data in the MSB page, the data combination circuit restores LSB data of a LSB page corresponding to an abnormal MSB page where the error occurs, by using plural sets of normal LSB data from the plural sets of LSB data and the data combination signal, wherein the normal LSB data is stored in the LSB pages corresponding to the MSB pages where MSB data is stored without error.

7. The semiconductor device of claim 6, wherein the memory device outputs the normal LSB data and the data combination signal to the memory controller.

8. The semiconductor device of claim 6, wherein the memory device stores the LSB data restored by the data combination circuit in the LSB page corresponding to the abnormal MSB page.

9. The semiconductor device of claim 1, the data combination circuit includes:
    a register configured to store the LSB data stored in the LSB page of the selected word line group; and a logical operation unit configured to generate the data combination signal using the LSB data stored in the register.

10. The semiconductor device of claim 1, wherein the data combination signal is generated by XOR operation about the plural sets of LSB data.

11. The semiconductor device of claim 6, wherein the LSB data is restored by XOR operation of the data combination signal and the plural sets of normal LSB data.

12. The semiconductor device of claim 3, the data combination circuit includes:
a register configured to store the normal LSB data read from the LSB page of the selected word line group; and
a logical operation unit configured to restore the LSB data of the LSB page corresponding to the abnormal MSB page using the normal LSB data and the data combination signal stored in the register.

13. A semiconductor device comprising:
a first memory block including word lines divided into two or more word line groups, each of the word line including a LSB page and a MSB page;
a second memory block including a plurality of pages;
a data combination circuit configured to generate a data combination signal by combining plural sets of LSB data stored in LSB pages of a word line group selected from the first memory block; and
an operation circuit configured to store the LSB data and MSB data in the first memory block and store the data combination signal in the second memory block.

14. The semiconductor device of claim 13, wherein the operation circuit stores the MSB data in the MSB page of the selected word line group after storing the data combination signal in the second memory block.

15. The semiconductor device of claim 13, wherein when an error occurs while storing the MSB data in the MSB page of the selected word line group in the first memory block, the data combination circuit restores the LSB data of a LSB page corresponding to an abnormal MSB page where the error occurs, by using normal LSB data and the data combination signal, wherein the normal LSB data is stored in LSB pages corresponding to MSB pages where MSB data is stored without error, of the selected word line group.

16. The semiconductor device of claim 15, wherein the operation circuit outputs the normal LSB data and the data combination signal to the data combination circuit.

17. The semiconductor device of claim 15, wherein the operation circuit stores the LSB data restored by the data combination circuit in the LSB page corresponding to the abnormal MSB page.

18. The semiconductor device of claim 13, wherein when an error occurs while storing the MSB data in the MSB page of the selected word line group in the first memory block, the data combination circuit restores the LSB data of a LSB page corresponding to an abnormal MSB page where the error occurs, by using plural sets of normal LSB data out of the plural sets of LSB data and the data combination signal, wherein the normal LSB data is stored in LSB pages corresponding to MSB pages where MSB data is stored without the error.

19. The semiconductor device of claim 18, wherein the operation circuit outputs the normal LSB data and the data combination signal to the data combination circuit.

20. The semiconductor device of claim 18, wherein the operation circuit stores the LSB data restored by the data combination circuit in the LSB page corresponding to the abnormal MSB page.

21. The semiconductor device of claim 13, the data combination circuit includes:
a register configured to store LSB data stored in the LSB page of the selected word line group; and
a logical operation unit configured to generate the data combination signal using the LSB data stored in the register.

22. The semiconductor device of claim 13, wherein the data combination signal is generated by XOR operation about the plural sets of LSB data.

23. The semiconductor device of claim 15, wherein the LSB data is restored by XOR operation of the data combination signal and the plural sets of normal LSB data.

24. The semiconductor device of claim 15, the data combination circuit includes:
a register configured to store the normal LSB data read from the LSB pages of the selected word line group; and
a logical operation unit configured to restore the LSB data of the LSB page corresponding to the abnormal MSB page using the normal LSB data and the data combination signal stored in the register.

25. A semiconductor device comprising:
a memory device configured to perform a first program operation of storing LSB data in a LSB page, a second program operation of storing a data combination signal, and a third program operation of storing MSB data in a MSB page; and
a data combination circuit for generating the data combination signal and restoring the LSB data of a LSB page corresponding to an abnormal MSB page where the error occurs.

26. The semiconductor device of claim 25, wherein the data combination circuit performs XOR operation about plural sets of the LSB data to generate the data combination signal.

27. The semiconductor device of claim 25, wherein the data combination circuit restores the LSB data in connection with the abnormal MSB page, by using normal LSB data stored in LSB pages corresponding to MSB pages where MSB data is stored without error, and the data combination signal.

28. The semiconductor device of claim 27, wherein the data combination circuit performs XOR operation about plural sets of the normal LSB data and the data combination signal to restore the LSB data in connection with the abnormal MSB page.

29. The semiconductor device of claim 27, wherein the memory device further configured to perform the first program operation of storing the restored LSB data in the original LSB page.

30. The semiconductor device of claim 29, wherein the memory device further configured to perform the third program operation of storing the MSB data in the abnormal MSB page after the first program operation of storing the restored LSB data in the original LSB page.

* * * * *